(12) United States Patent
Uchikoba

(10) Patent No.: US 6,628,178 B2
(45) Date of Patent: Sep. 30, 2003

(54) RADIO FREQUENCY MODULE PARTS INCLUDING SURFACE ACOUSTIC WAVE ELEMENTS AND MANUFACTURING METHOD THEREOF

(75) Inventor: Fumio Uchikoba, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/940,440

(22) Filed: Aug. 29, 2001

(65) Prior Publication Data
US 2002/0044030 A1 Apr. 18, 2002

(30) Foreign Application Priority Data
Aug. 30, 2000 (JP) ........................... 2000-260206

(51) Int. Cl.$^7$ .................. H03H 9/10; H03H 9/64; H03H 9/05; H05K 5/06; H05K 7/06
(52) U.S. Cl. ................... 333/193; 333/133; 310/349; 257/728; 257/778; 257/779; 361/760
(58) Field of Search .................. 333/133, 193–196; 29/25, 35; 310/313 R, 349; 361/760, 762; 257/729, 778, 779

(56) References Cited

U.S. PATENT DOCUMENTS

| | | | | |
|---|---|---|---|---|
| 4,736,128 A | * | 4/1988 | Takoshima et al. | 310/313 R |
| 4,737,742 A | * | 4/1988 | Takoshima et al. | 333/150 |
| 5,281,883 A | * | 1/1994 | Ikata et al. | 310/313 R |
| 5,459,368 A | * | 10/1995 | Onishi et al. | 310/313 R |
| 5,699,027 A | * | 12/1997 | Tsuji et al. | 333/193 |
| 5,872,493 A | * | 2/1999 | Ella | 333/191 |
| 5,962,950 A | * | 10/1999 | Egara et al. | 310/313 R |
| 6,285,559 B1 | * | 9/2001 | Fukiharu | 361/760 |
| 6,320,739 B1 | * | 11/2001 | Gotoh et al. | 361/386 |
| 6,339,365 B1 | * | 1/2002 | Kawase et al. | 333/193 |
| 6,351,194 B2 | * | 2/2002 | Takahashi et al. | 333/133 |
| 6,498,422 B1 | * | 12/2002 | Hori | 310/344 |

FOREIGN PATENT DOCUMENTS

| | | | |
|---|---|---|---|
| DE | 196 48 308 | | 5/1997 |
| EP | 0 638 926 A1 | * | 2/1995 |
| EP | 0 794 616 | | 9/1997 |
| GB | 2307596 A | * | 5/1997 |
| JP | 6-97315 | | 4/1994 |
| JP | 10-79638 | | 3/1998 |
| JP | 11-340416 | * | 12/1999 |

* cited by examiner

*Primary Examiner*—Barbara Summons
(74) *Attorney, Agent, or Firm*—Oblon, Spivak, McClelland, Maier & Neustadt, P.C.

(57) ABSTRACT

The surface acoustic wave elements and the other surface mounting elements are mounted on a ceramic multi-layer substrate. The surface acoustic wave elements may be flip chips face-down-bonded to the gold coated mounting electrodes of the multi-layer ceramic substrate by gold-to-gold bonding. At least the surface acoustic wave elements are covered as sealed airtight with the side walls fixed to the multi-layer ceramic substrate and a cover closing the opening of the side walls.

5 Claims, 9 Drawing Sheets

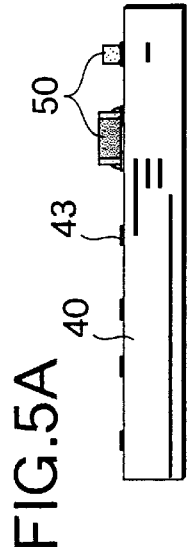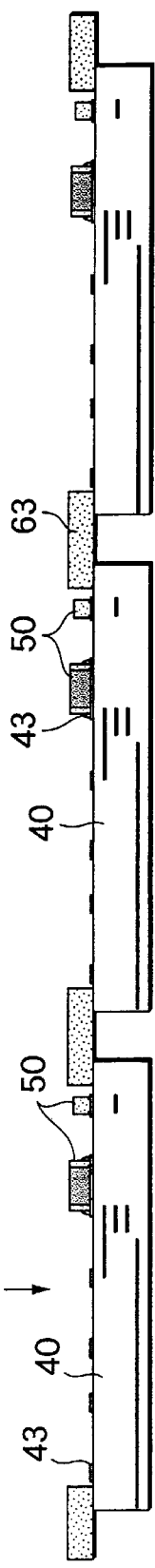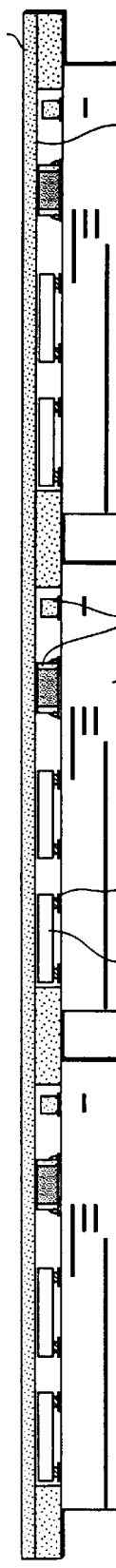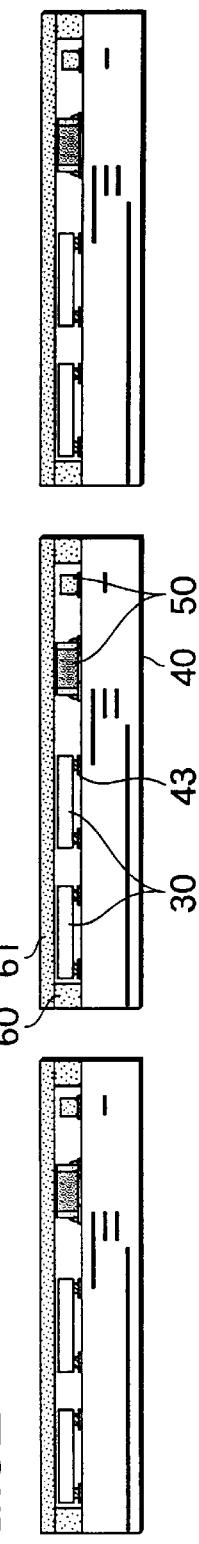

RADIO FREQUENCY MODULE PARTS INCLUDING SURFACE ACOUSTIC WAVE ELEMENTS AND MANUFACTURING METHOD THEREOF

BACKGROUND OF THE INVENTION

The present invention relates to radio frequency module parts including surface acoustic wave elements of flip chip type which are mounted on a ceramic multi-layer substrate. In particular, this invention relates to radio frequency module parts including surface acoustic wave elements having increased reliability, improved element mounting efficiency, and reduced product size. The present invention also provides a manufacturing method for radio frequency module parts that enables increased productivity.

Miniaturization of electronic appliances is always increasing in the market. The size and weight of parts must also be reduced. These requirements are particularly remarkable in radio frequency appliances, such as mobile telephones. With respect to radio frequency appliances, electronic parts are mounted with high density, and the size and weight of the parts has been reduced. For miniaturization, a multi-layer substrate having plural conductor layers is mainly used in place of a conventional substrate having a single-layer conductor.

The ceramic multi-layer substrate is composed of an insulating layer formed of ceramics as an electrical insulator, and a conductive layer is formed with a metal, such as silver. In comparison to a general resin multi-layer substrate, the ceramic multi-layer substrate achieves low loss at radio frequency, good heat conductivity, dimensional high precision, and excellent reliability.

The ceramic multi-layer substrate is provided with internal conductors which are coiled or arranged opposite to each other in parallel so that inductance and capacitance may be formed therein. It is possible to form internal elements with low loss and high dimensional precision within the ceramic multi-layer substrate.

These ceramic multi-layer substrates are used as a module in radio frequency circuits such as mobile telephones. These ceramic multi-layer substrates are useful because various parts may be mounted on the surface to form small integrated elements.

Since radio frequency modules have circuits assembled based on each function, in comparison with a conventional technique of mounting discrete components one by one to form circuits, the structure of the module is simple and reliable. The present invention also enables modularization, which reduces manufacturing costs and simplifies device design.

FIG. 9 shows a block diagram of the radio frequency circuit of a mobile telephone of GSM dual band type which is most commonly used in the world. In FIG. 9, ANT is an antenna for transmitting and receiving electric waves, DPX is a diplexer (2-frequency filter) for separating a plurality of frequencies, T/R SW is a transmission/receiving switch for switching transmission and receiving, LPF is a low-pass filter for controlling the radio frequency at a transmission stage, and BPF is a band-pass filter at a receiving stage.

In such circuits of mobile telephones, the module is formed with a certain number of functions by actually mounting elements on the multi-layer substrate, for example, at the power amplifier portion in the transmission based circuit and at the antenna switch portion. FIGS. 10 and 11 show the structures of the respective examples.

FIG. 10 shows an example of a power amplifier module, where reference numeral 1 designates a dielectric multi-layer substrate having an internal electrode 1a and external electrodes 1b. On the dielectric multi-layer substrate, there are mounted MMIC which is a main portion of power amplifier and chip members 2 of the peripheral circuits. The MMCI is protected by a protection coating 3 and the upper side of the dielectric multi-layer substrate is entirely covered with a shield case 4.

FIG. 11 shows an example of a front-end module including the antenna switch portion, where reference numeral 10 is a ceramic multi-layer substrate having an internal inductance portion 11, capacitor portions 12, and external electrodes 13. Further, on the ceramic multi-layer substrate 10, there are mounted chip members 15 including diodes, resistors, and the like, and a shield case 16 for entirely covering the upper side of the ceramic multi-layer substrate. However, the front-end module of FIG. 11 does not include the surface acoustic wave element (hereafter the "SAW element").

Nowadays, module formation is realized in a single function such as a power amplifier and antenna switch module. Greater benefits of modularization may be obtained by including more functions in each module. It is a matter of course that the module formation including the SAW elements will be important.

The conventional SAW elements have been package members. It is possible to form the module by mounting the package members. However, as will be described in connection with the invention, mounting of element chips directly on the substrate enables a product which is miniaturized and reduced in thickness. Further, the production cost is reduced.

The ceramic multi-layer substrate, by having internal conductance and capacitance, achieves miniaturization. However, height reduction is more difficult. Therefore, the generally available module having the package mounted on the substrate will not satisfy the ever-increasing demand for reduction of height. Further, the package member occupies a wide area as compared to an original bear chip. Among the components to be used, the SAW element is one of the tallest components and occupies a broad area. Under these circumstances, the SAW element should be directly mounted to the ceramic multi-layer substrate without using the package.

On the other hand, for production of the SAW element, there is a process of forming the SAW chip and a process of mounting the SAW element to the package and sealing the same. Reduced costs for these processes are needed. If the SAW element may be directly mounted to the ceramic multi-layer substrate, the production cost will be reduced because the processes for mounting on the package and sealing may not be needed.

As has been described, regarding the radio frequency module, it is desirable to directly mount the SAW element to the ceramic multi-layer substrate to which other members are mounted by soldering.

In achieving the aforementioned goals, several problems arise, particularly:

(1) It is required to airtightly seal the SAW element chip;
(2) the structure should be resistant to temperature change without affecting the surface acoustic wave properties;
(3) the soldering process and the mounting process of the SAW element should be compatible.
(4) the module should have a flat surface while minimizing the module height;

(5) a plurality of ceramic multi-layer substrates should be mounted simultaneously, thereby increasing the production efficiency.

(1) Regarding the Requirement for Airtight-sealing the SAW Element:

The SAW element is made, for example, by forming a ladder-like electrode of aluminum at a precision of sub-micron ($\mu$m) order, for example, on a lithium tantalite substrate. The electrode pattern is precisely designed for obtaining important properties including resonance frequency, bandwidth, insertion loss, and out-of-band loss. For example, an error of 1 $\mu$m will not satisfy the design specification.

This precisely designed element is very likely to be influenced by external air. Contaminants such as water content from humidity and adherence of dust and the like damage the SAW element.

Accordingly, the SAW element mounting procedure should account for the above-described difficulties and should be compatible with miniaturization.

(2) Regarding the Requirement for Supporting the Element Free of Influence to the Surface Acoustic Waves:

When mounting the bear chips of a silicon based integrated circuit, the chips may be mounted to the substrate firmly and with entire surface adhered by, for example, an adhesive. However in the case of the SAW element, since the resonance property is obtained by the presence of elastic waves at the surface of the element, it is impossible to firmly fix the entire surface of the chips to the substrate by use of an adhesive.

In the case of the existing small SAW element, as disclosed for example, in JP-A-10-79638, the element is fixed to a ceramic substrate or a resin substrate by way of flip chip mounting. This is shown in FIG. 12, where reference numeral 20 is a substrate, and 30 is a flip chip as the SAW element. On the substrate 20, there is formed an electrode 21, the surface of which is gold (Au), and the flip chip 30 has a gold stud bump 31 formed on the main surface thereof which is formed with a ladder-type electrode for the SAW. The flip chip 30 is mounted (face-down-bonding) by way of gold-to-gold bonding where the main surface formed with the ladder type electrode for the SAW turned down.

It is also effective to follow this method for mounting the SAW element. However, the mounting process of the present invention is complicated when combined with other soldering members. Particularly in a composite module, the ceramic multi-layer substrate becomes thick. In this case, stress applied to the bonding portions is large compared to a normal package member.

(3) Regarding the Requirement for Making Compatible the Soldering Process and the SAW Element Mounting Process:

Generally in the soldering process, a solder paste is printed to the land portions on the substrate surface, and then the elements are placed and heat-treated through a reflow furnace fix the same thereon. In this case, a flux existing in the paste is evaporated to activate an interface relative to the surface electrodes, thereby securing wetness of the solder.

In the case of the present invention, the SAW element is mounted while exposed. If mounted in advance without securing air-tightness, flux may affect the properties of the SAW element.

Further, the SAW element is generally bonded by gold-to-gold bump bonding. In the case of the solder bonding, the metal surface on the substrate is a tin- film or a solder-film, and these are normally formed by plating.

(4) Regarding the Requirement for Flattening The Module Surface and Reducing the Height Thereof:

For mounting the electronic members, a method using an automatic mounting machine has been established and broadly employed. The apparatus normally includes a vacuum absorbing nozzle for handling the members. The member should therefore have a flat surface which is wider than at least the diameter of the nozzle. According to the prior art method, the surface of the composite module is covered with a metal plate. However, in the present invention, the addition of a flattening structure to the airtight structure is contrary to the requirement for reducing the height.

(5) Regarding the Requirement for Increasing the Production Efficiency by Treating a Plurality of Ceramic Multi-layer Substrates Simultaneously:

Normally, the ceramic multi-layer substrates are individually treated through a individual processes. However, the individual treatment requires much labor and decreases efficiency, which, in turn, increases production cost. Thus, it is desired to treat a plurality of pieces of the ceramic multi-layer substrates simultaneously.

JP-A-6-97315 discloses a preceding example of mounting the SAW element together with other circuit members and sealing the same. According to the preceding example, the SAW element is fixed as is turned up to a resin substrate and is electrically connected by wire bonding. This is different from the present invention, which mounts the SAW element to the multi-layer ceramic substrate in the form of a flip chip. According to the invention, by way of the flip chip mounting, miniaturization may be realized. By using the flip chip technique, the influence due to differences in the heat expansion rates between the chip and the substrate may be reduced. JP-A-6-97315 refers to the differences in the heat expansion rate between the ceramic substrates, which gives rise to problems. However, in the present invention, such influence is extremely little. Particularly, the temperature coefficient of the SAW element and the difference in the heat expansion rate are likely offset, and the temperature property of center frequency of the flip chip in the case of the resin substrate and in the case of the ceramic substrate is better in the ceramic substrate as shown in FIG. 4.

JP-A-6-97315 seems to disclose the mounting in combination with other passive members, but does not disclose the mounting together with the solder mounting members. Particularly, the solder is used for sealing but in this case, for avoiding contamination by flux, an instantaneous heating method is employed. In short, it is suggested that the mounting in combination with the solder mounting members is extremely difficult. In the present invention, the mounting together with other solder mounting members may be available by taking a cleaning process (cleaning process); and the present invention simplifies the problem and enables other various members to be mounted together.

SUMMARY OF THE INVENTION

Accordingly, in view of the above-mentioned difficulties, it is a first object of the invention to provide radio frequency module parts including SAW elements and a manufacturing method thereof, enabling the mounting of a SAW element as a bear chip together with other solder mounted members.

It is a second object of the invention to provide radio frequency module parts including SAW elements and a manufacturing method thereof, where the SAW element may be mounted as a bear chip, thereby to secure miniaturization, reduction in height, increase of production efficiency, and reduced manufacturing costs.

Other objects and characteristics of the invention will be apparent in the following description in reference to the modes for carrying out the invention.

For attaining the above-noted objects, the radio frequency module parts including SAW elements according to a first aspect of the invention are characterized in that a ceramic multi-layer substrate is mounted thereon with SAW elements and other surface mounting elements, the surface acoustic wave elements being flip chips which are face-down-bonded by way of gold-to-gold bonding to gold-coated electrodes of the ceramic multi-layer substrate, and at least the SAW elements being covered airtight with side walls fixed to the ceramic multi-layer substrate and a cover covering the opening of the side walls.

According to a second aspect of the invention, the radio frequency module parts including SAW elements as set forth in the first aspect of the invention is characterized in that at least one of the other surface mounting elements is mounted on the ceramic multi-layer substrate by way of soldering.

According to a third aspect of the invention, the radio frequency module parts including surface acoustic wave elements as set forth in the first or second aspect of the invention is characterized in that said surface acoustic wave elements are isolated from said other surface mounting elements by the side walls and the cover.

According to a fourth aspect of the invention, the radio frequency module parts including SAW elements as set forth in the first, second, or third aspect of the invention are characterized in that the area of a portion surrounded by the side walls and covered by the cover is between approximately 30% and 100% of said ceramic multi-layer substrate.

According to a fifth aspect of the invention, the radio frequency module parts including SAW elements as set forth in the first, second, third, or fourth aspect of the invention are characterized in that the gold film of the gold plated electrodes of the ceramic multi-layer substrate is between about 1 µm and about 5 µm, the space between the SAW elements and the gold plated electrodes is between about 5 µm and about 50 µm, and the diameter after bonding the gold bumps for the gold-to-gold bonding is between about 50 µm and about 150 µm.

A method of making radio frequency module parts including SAW elements according to a sixth aspect of the invention includes the steps of: plating a gold plate to at least portions of bonding parts of conductive surfaces of a ceramic multi-layer substrate; mounting by soldering, after the plating procedure, at least one surface mounting element other than the SAW elements to the ceramic multi-layer substrate; cleaning the multi-layer ceramic substrate after the soldering; mounting, after the cleaning procedure, flip chips of the SAW elements via face-down-bonding to the ceramic multi-layer substrate by gold-to-gold bonding; bonding members becoming side walls to the ceramic multi-layer substrate; and airtight sealing a space surrounded by the members becoming the side walls and a member becoming a cover by attaching the member becoming the cover after mounting the SAW elements and forming the side walls.

According to a seventh aspect of the invention, the method of making the radio frequency module parts including the SAW elements as set forth in the sixth aspect of the invention is characterized in that the side wall forming procedure is carried out by bonding the side wall forming members in common to plural pieces of the ceramic multi-layer substrates, and at least parts of the following steps thereafter are carried out simultaneously, and the members finally becoming the sides are cut per each of ceramic multi-layer substrates.

According to an eighth aspect of the invention, the method of making the radio frequency module parts including the SAW elements as set forth in the sixth or seventh aspect of the invention is characterized in that the cleaning procedure is for cleaning said ceramic multi-layer substrate by way of a plasma etching.

BRIEF DESCRIPTION OF THE DRAWINGS

FIGS. 5A to 5E are explanatory views showing the production processes of the second mode for carrying out the invention;

DETAILED DESCRIPTION OF THE EMBODIMENTS OF THE INVENTION

Figure 1:
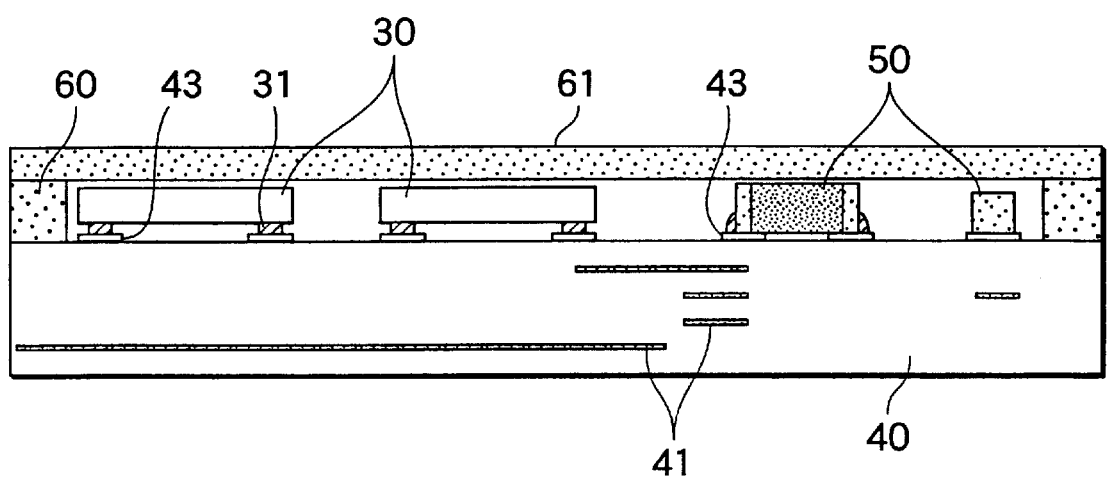
FIG. 1 is a front and cross-sectional view of the radio frequency module parts including the SAW elements according to the first mode for carrying out the invention.

The following explanation for carrying out the radio frequency module parts including the SAW elements and the manufacturing method thereof according to the present invention includes reference to the attached drawings, wherein like reference numerals refer to identical parts throughout the drawings.

FIG. 1 is a first mode for carrying out the invention showing an accomplished condition of the radio frequency module parts including the SAW elements. FIGS. 2A to 2G show the production procedure thereof. FIG. 3 shows a circuit therefor.

Figure 2A:
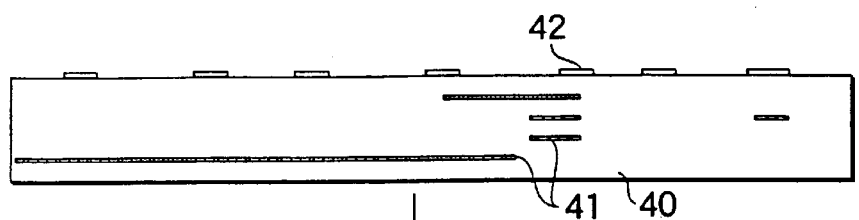
FIGS. 2A to 2G are explanatory views showing the production processes of the first mode.

The first mode will be described sequentially with reference to the production processes as shown in FIGS. 2A to 2G. In FIG. 2A, reference numeral 40 denotes the ceramic multi-layer substrate composed of 15 layers of inner electric conductors 41 having alumina glass composite ceramics as insulating layers. An external form was about 6 mm×4 mm with thickness being 0.8 mm. The surface conductive layer 42 of the ceramic multi-layer substrate 40 was formed with a sintered silver conductor.

Figure 2B:
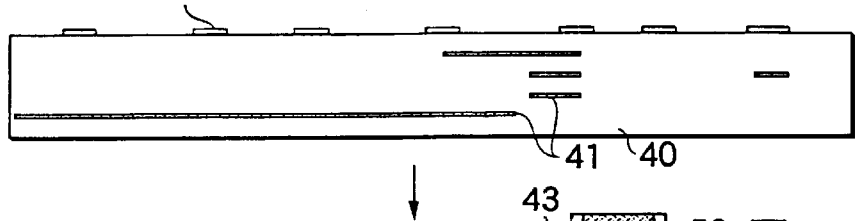
Figure 3:
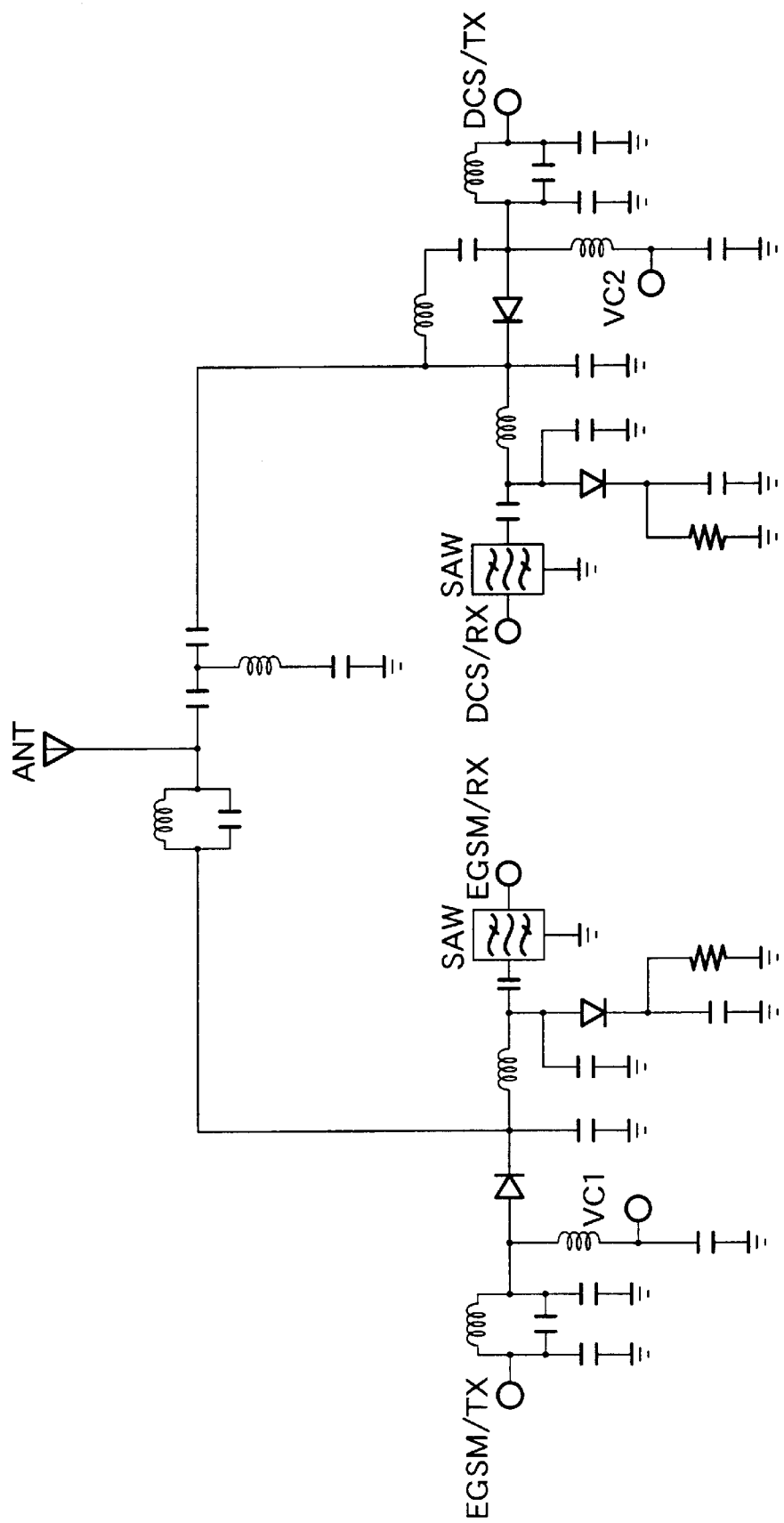
FIG. 3 is a diagrammatic view of a circuit in the first mode.

In the gold plating treatment procedure as shown in FIG. 2B, the ceramic multi-layer substrate 40 was plated with nickel of about 2 to 3 µm as a foundation plating on the surface conductive layer 42 (sintered silver conductor), followed by gold-plating to form mounting electrodes 43 having the gold film.

Figure 2C:
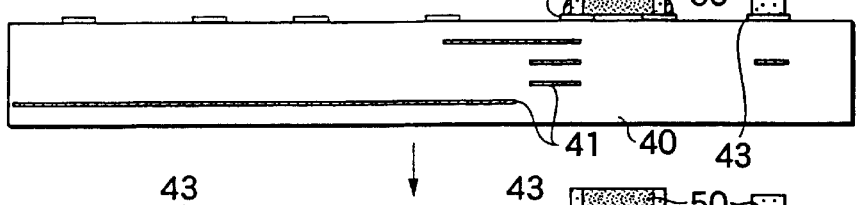

In the procedure for mounting the soldered parts in FIG. 2C, on the ceramic multi-layer substrate 40, the soldering paste was coated on the solder-connected portions of the mounting electrodes 43 which had been formed with the gold film, and the solder members 50 (the surface mounting elements to be soldered) composing inductance, capacitance, resistor, diode and the like in the circuit of FIG. 3. Subsequently, the solder was fixed through the reflow furnace. Thus, the respective members 50 were fixed by soldering to the surface conductive layers 42 plated with the gold film, in short, the mounted electrodes 43.

Figure 2D:
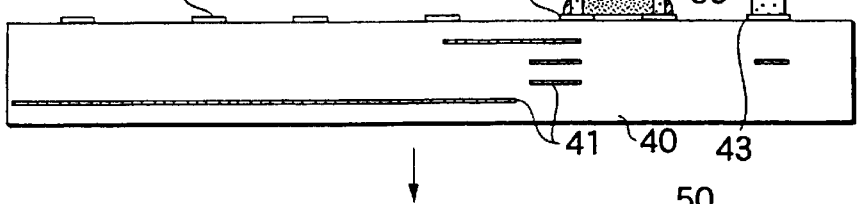

Thereafter, in the cleaning procedure shown in FIG. 2D, the ceramic multi-layer substrate 40 having the solder members 50 mounted thereon was subjected to alkali medicine liquid cleaning or plasma cleaning (plasma etching).

Figure 2E:
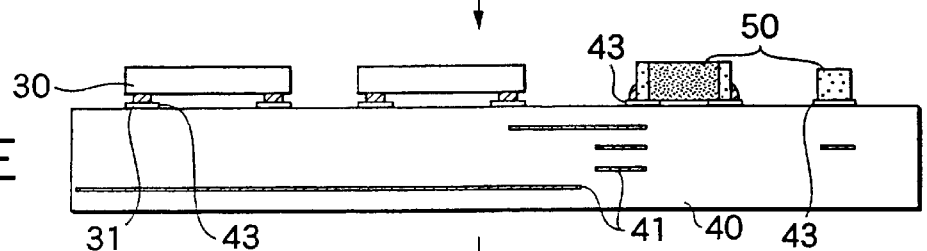
Figure 12:
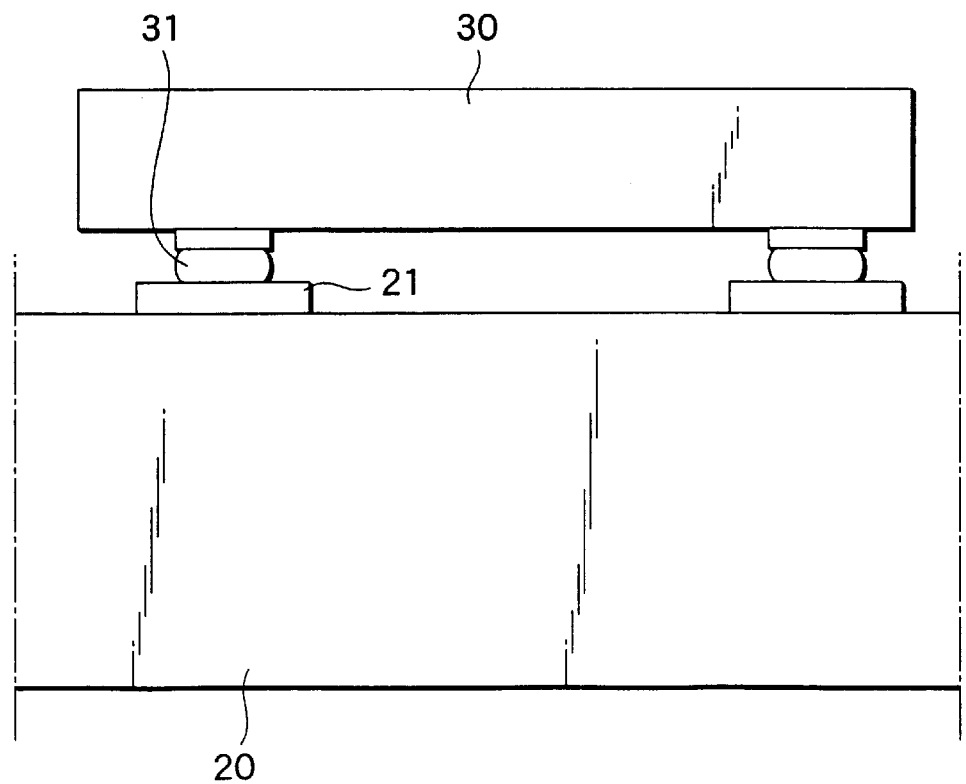
FIG. 12 is a front and cross-sectional view of showing an example of face-down-bonding (flip chip mounted) by gold-to-gold bonding the SAW.

In the flip chip mounting procedure shown in FIG. 2E where the SAW element was mounted with gold-to-gold bonding, the SAW element was not the package member but the flip chip mounting type SAW element, i.e., the flip chip 30 being the bear chip as shown in FIG. 12. The flip chip 30 passed a similar process as the package member and was formed with the gold stud bump 31 on the main surface provided with the ladder-type electrodes for the SAW element (in short, this may be obtained by omitting the processes of mounting to the package and sealing of the latter half in the package member). The flip chip 30 was mounted by gold-to-gold bonding to the mounting electrodes 43 on the ceramic multi-layer substrate 40 in a manner of turning down the main surface provided with the ladder-type electrodes for the SAW element (face-down-bonding).

By changing the diameter of the gold line and the forming conditions, the diameter of the gold stud bump 31 may be varied within a proper range. By changing the length of the gold line, the length of the gold stud bump 31 may be varied and the gap between the mounting electrode 43 on the substrate 40 and the flip chip 30 may be set in a proper range. The face-down-bonding of the flip chip 30 was performed so that the flip chip 30 was placed at a predetermined position turned down, and a ultrasonic wave of 9 W was applied for 0.6 seconds on the side of the flip chip 30 while a load of 300 g was simultaneously applied. Thus the gold stud bump 31 was bonded by way of the ultrasonic waves to the gold surface of the mounting electrode 43 on the side of the substrate.

The shear strength of the flip chip 30 as the SAW element in case of changing the cleaning process to non-cleaning, alkali chemical cleaning, will be discussed later in reference to Table 1. The relation between the gold plated thickness of the mounting electrode 43 and the shear strength of the flip chip 30 as well as the solder member 50, will be discussed later in reference to Table 2. The diameter of the gold bump after mounting the flip chip 30 (after the ultrasonic wave bonding), the shear strength and the influences given to results of the heat impact test, will be discussed later in reference to Table 3. Further, influences of the gap spaces between the mounting electrode 43 and the flip chip 30 on the substrate 40 given to the horizontal pushing and results of the heat impact test, will be discussed later in reference to Table 4. When measuring in Tables 1 to 4, the electronic microscope inspected the cross sections, diameters, and interfaces of the gold bump during the mounting process.

Figure 2F:
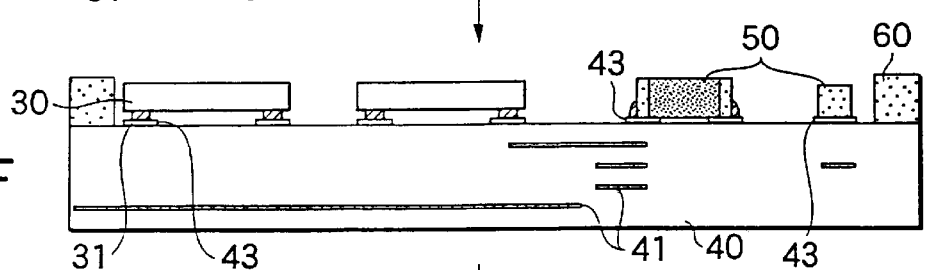
Figure 2G:
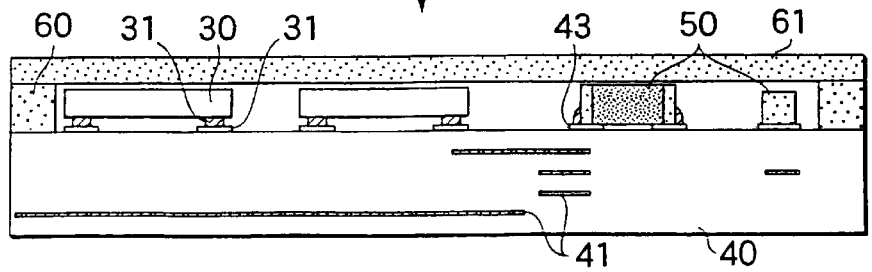

After the flip chip 30 as the SAW element was mounted, as shown in FIG. 2F, the plate of square framed epoxy resin was bonded on the ceramic multi-layer substrate 40, said plate being hollowed out to become the resin side wall 60 for receiving the flip chip 30 as the SAW element and the solder member 50, and further as shown in FIG. 2G, the epoxy resin plate becoming the cover 61 was bonded by means of an adhesive, and was further bonded for 5 hours in vacuum to more strengthen the bonding.

Through the procedures shown in FIGS. 2A to 2G, the ceramic multi-layer substrate 40 having the internal conductive layers 41 shown in FIG. 1 were mounted thereon with the flip chip 30 as the SAW element and the other solder members 50 as the surface mounting elements, wherein the solder members 50 were soldered on the ceramic multi-layer substrate 40, and the flip chip 30 having the gold bump 31 was face-down-bonded by way of gold-to-gold bonding (gold ball bond method) to the gold plated mounting electrode 43 of the ceramic multi-layer substrate 40, and further the flip chip 30 and the other solder members 50 were airtightly sealed by the side wall 60 of the resin and the resin cover 61 for covering the opening of this side wall fixed to the ceramic multi-layer substrate 40. The radio frequency module parts sealed airtight were obtained. The radio frequency module parts had the external form of length and width 6 mm×4 mm and height 1.5 mm.

Figure 8:
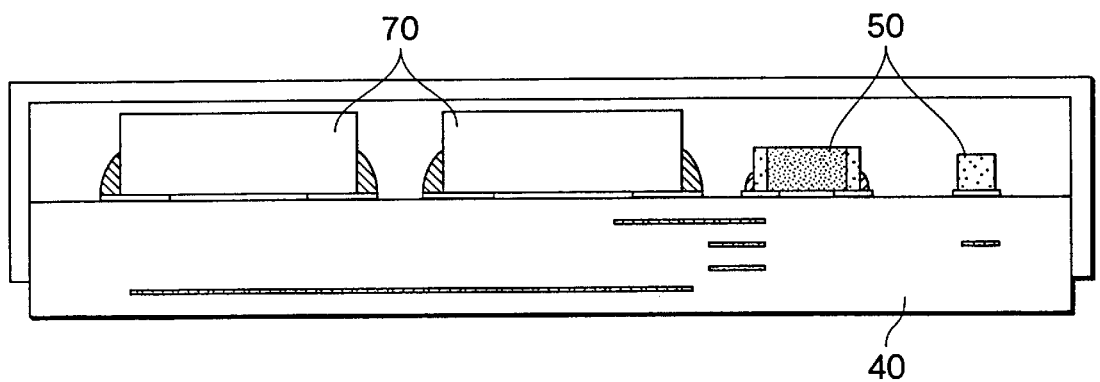
FIG. 8 is a front and cross-sectional view showing an example of the module mounted thereon with the package member of the conventional SAW elements.
Figure 9:
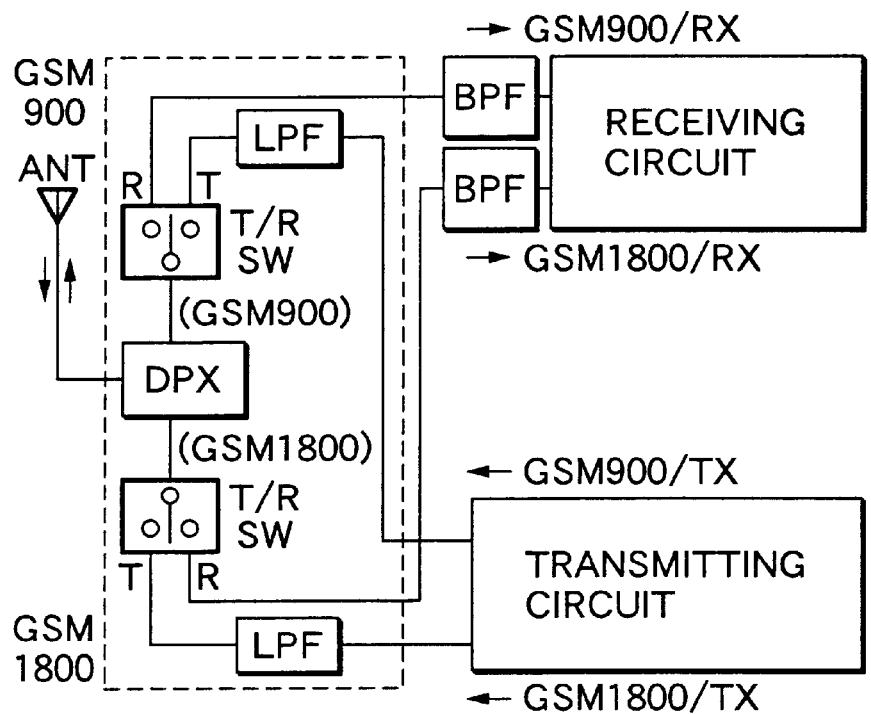
FIG. 9 is a block diagrammatic view of the radio frequency circuit for GSM dual band type mobile telephone.
Figure 10:
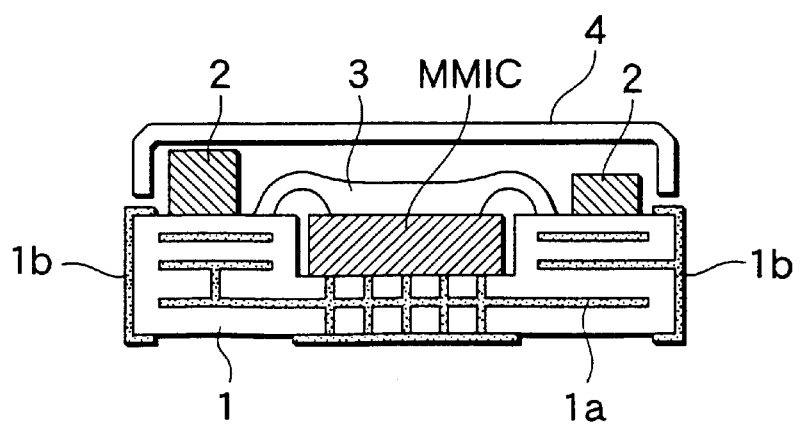
FIG. 10 is a front and cross-sectional view of the power amplifier module.
Figure 11:
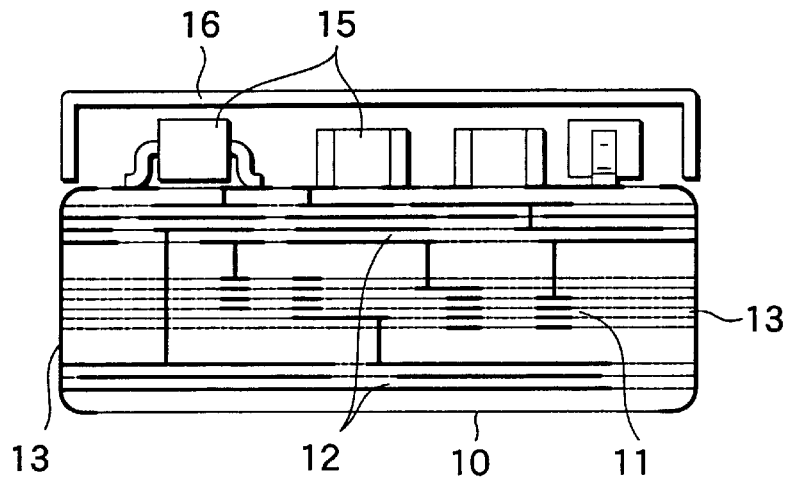
FIG. 11 is a front and cross-sectional view showing the front end module including the antenna switch portion.

In the circuit shown in FIG. 3, the portions except the SAW element are already completed in the form of product as the module with a size about 6 mm×4 mm likewise. The module of the same size may have the two SAW elements mounted thereon, from which it is seen that this may be sufficiently miniaturized. Further, the module according to the present embodiment has a height of 1.5 mm. As shown in FIG. 8, when the SAW package member 70 is simply mounted on the conventional product (the module having the solder members 50 mounted on the ceramic multi-layer substrate 40), the height is about 2 mm. It is apparent that the height is sufficiently reduced in comparison with the conventional one as shown in FIG. 8.

Figure 4:
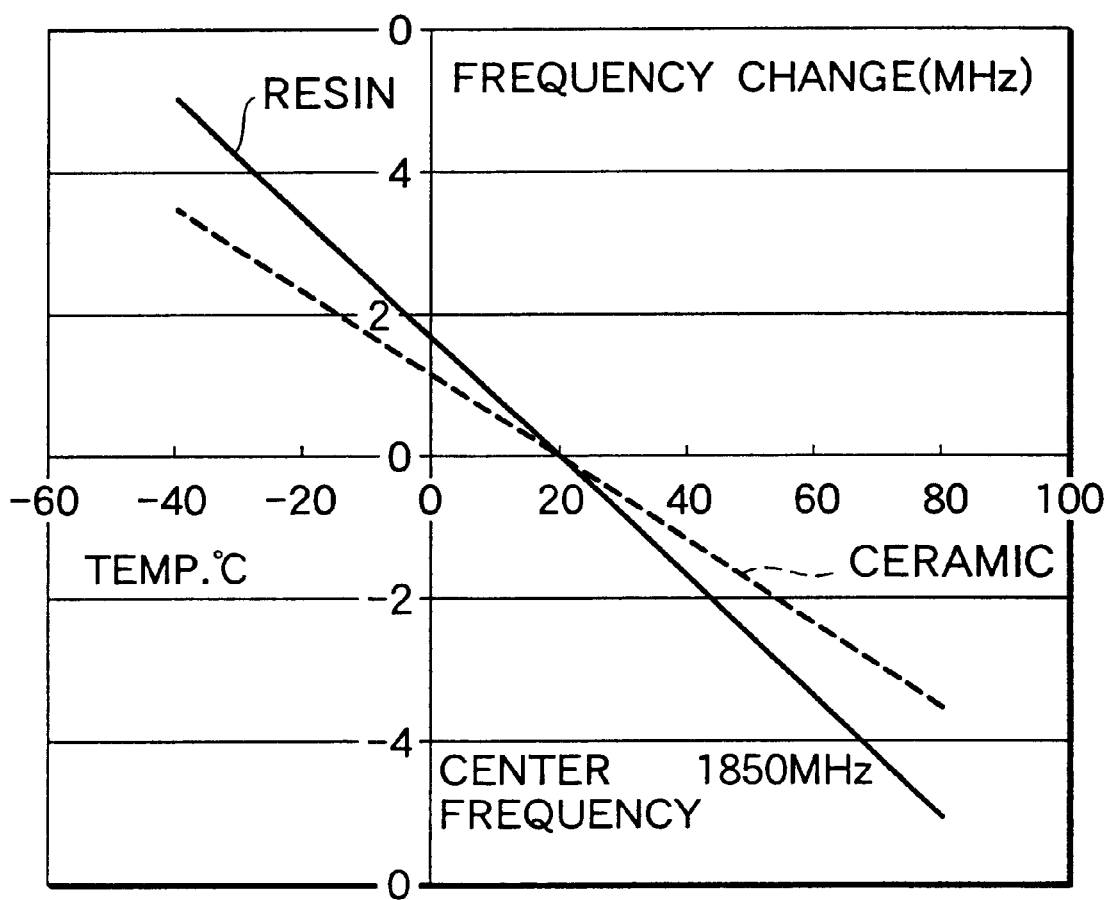
FIG. 4 is a diagrammatic view of the ceramic substrate and the resin substrate showing the temperature characteristics of the SAW elements.

FIG. 4 shows the temperature characteristics when the flip chip of the SAW element is mounted on the ceramic multi-layer substrate as the present embodiment (dotted line), and when the flip chip is similarly mounted on the resin substrate (solid line). It may be seen that the ceramic multi-layer substrate is less in change of frequency in company with the temperature change.

Table 1 shows the shear strength when the test samples were produced by changing the cleaning process to non-cleaning, alkali chemical liquid cleaning, and plasma cleanings respectively. The diameter of the gold bump was 100 µm after mounting the flip chip 30, the gap distance between the mounted electrode 43 and the flip chip 30 on the substrate 40 was 20 µm, and the gold plated film of the mounted electrode 43 of the substrate side was 0.5 µm.

Table 1

TABLE 1

| Influences of the cleaning process on the shear strength. | |
|---|---|
| Method of Cleaning | Shear strength |
| Non-cleaning | 350 |
| Chemical liquid cleaning | 400 |
| Plasma cleaning: 450W | |
| 1 min | 360 |
| 2 min | 420 |

TABLE 1-continued

Influences of the cleaning process on the shear strength.

| Method of Cleaning | Shear strength |
| --- | --- |
| 3 min | 450 |
| 5 min | 460 |
| 8 min | 460 |
| 10 min | 360 |
| 15 min | 320 |

As is apparent from Table 1, in the case of non-cleaning, the fixing strength is extremely weak. This sample was fixedly inserted in the buried resin, polished on the surface, and observed at the cross section by the electronic microscope, foreign matters like flux were attached to the surface. Foreign matters caused reduction of the shear strength. The medicine liquid cleaning was performed with alkali based cleaning liquid. In this case, the test sample was suitable for practical use. The plasma cleaning performed by spattering in argon plasma resulted as follows, with an output of 450 W constant and using time as a parameter: 1 minute is not yet sufficient for the required strength. In the time exceeding 10 minutes, the required strength becomes insufficient. In the time less than 1 minute, the surface was not activated, and in the time more than 10 minutes, the mounting electrode 43 was found to have injures at the gold surface layer. The preferred time range is from about 2 minutes to about 8 minutes.

Table 2 shows the shear strength when the test samples were produced by changing the gold plated thickness of the mounted electrode 43 on the substrate 40 from about 0.05 $\mu$m to about 7.0 $\mu$m with respect to a 1005 chip inductor (1×0.5×0.5 mm) as the flip chip 30 and the soldering member 50.

In this case, the diameter of the gold bump was 100 $\mu$m after mounting the flip chip 30, the gap distance was 20 $\mu$m between the mounted electrode 43 and the flip chip 30 on the substrate 40, and the gap distance was 20 $\mu$m between the mounted electrode 43 and the 1005 chip inductor, and the plasma cleaning was for 5 minutes.

Table 2

TABLE 2

Influences of the plated thickness to the shear strength of the SAW element and the solder mounting chip respectively.

| Gold plated thickness ($\mu$m) | Shear strength of SAW (gf) | Shear strength of chip parts (gf) |
| --- | --- | --- |
| 0.05 | 310 | 800 |
| 0.1 | 400 | 1200 |
| 0.3 | 420 | 1500 |
| 0.5 | 460 | 1600 |
| 1.0 | 470 | 1700 |
| 2.0 | 480 | 1600 |
| 3.0 | 470 | 1700 |
| 5.0 | 480 | 1700 |
| 7.0 | 480 | 800 Peeling Occurred |

From the results shown in Table 2, it was found that when the thickness of the gold plated layer was less than 0.1 $\mu$m, the strength was extremely low in the case of the gold-to-gold bonding and also in the case of the gold-to-solder bonding. There was no particular problem when the thickness of gold plated layer exceeded 5 $\mu$m. However, in the case of solder bonding, shear strength was extremely reduced where friction was produced between the plated layer and the silver bed. This indicates that stress is concentrated at the interface at the time of fixing the solder. Therefore, the gold plated thickness as the gold film is preferably between about 0.1 $\mu$m and about 5 $\mu$m, and more preferably in the region between about 0.3 $\mu$m and about 3 $\mu$m.

Table 3 shows the results measured as to the influence of the diameter of the gold bump on the shear strength and the heat impact test of the flip chip 30. The samples were made by changing the diameters of the gold bump in the region between 30 $\mu$m to 200 $\mu$m when the flip chip 30 as the SAW element was face-down-bonded to the substrate 40.

Table 3

TABLE 3

Influence of diameter of the gold bump on the shear strength and the heat impact test result of the SAW element.

| Diameter of gold bump ($\mu$m) | Shear strength of SAW (gf) | Failure in the heat impact test (among 100 pieces) |
| --- | --- | --- |
| 30 | 290 | 12 |
| 50 | 400 | 1 |
| 70 | 450 | 0 |
| 100 | 460 | 0 |
| 120 | 460 | 0 |
| 150 | 470 | 1 |
| 200 | 470 | 8 |

Herein, the heat impact test was made for clarifying the conditions. The test conditions included −40° C. at the low temperature side and 85° C. at the high temperature side which were held for 30 minutes at 100 cycles, respectively. The estimation was made by measuring the insertion loss of the SAW element. Initially, 2 dB was set as the failure value. As testing continued, values increasing to 5 dB and greater were also considered failures. The estimation was decided by the number of failures for 100 samples. The other measuring conditions included the gold plated film being 0.5 $\mu$m of the mounted electrode 43 of the substrate side, the gap being 20 $\mu$m between the mounting electrode 43 and the flip chip 30 on the substrate 40, and the plasma cleaning being 5 minutes.

From the results as shown in Table 3, it was found that as the gold bump diameter decreased to less than about 50 $\mu$m, the strength remarkably decreased and the percent of defective elements increased after receiving the heat impact. When the gold bump diameter exceeded 150 $\mu$m, the shear strength was sufficiently high but the rate of defects increased after receiving the heat impact. In this case, it was found that peeling often occurred at the SAW element electrode. This suggests that when the gold bump becomes extremely thick, the stress of heat impact is concentrated to the SAW element side. Therefore, it is preferable that the gold bump is between about 50 $\mu$m and 150 $\mu$m at the time of mounting, and more preferably in the range of about 70 $\mu$m to about 120 $\mu$m.

Table 4 illustrates the influence of the gap distance between the mounted electrode 43 and the flip chip 30 on the substrate 40 on the shear strength and the heat impact test result of the flip chip 30. The samples were prepared to have the gap varied from about 3 $\mu$m to about 70 $\mu$m between the mounting electrode 43 and the flip chip 30. The gold film of the mounting electrode 43 of the substrate side was 0.5 $\mu$m, the gold lump diameter was 100 $\mu$m, the plasma cleaning was for 5 minutes and the heat impact test at −40° C. to 85° C. was 100 cycle.

Table 4

TABLE 4

Influence of the gap on the shear strength and the heat impact test result of the SAW element.

| Gap distance ($\mu$m) | Shear strength of SAW (gf) | Failure in the heat impact test (among 100 samples) |
|---|---|---|
| 3 | 450 | 15 |
| 5 | 440 | 2 |
| 10 | 450 | 0 |
| 20 | 460 | 0 |
| 30 | 460 | 0 |
| 50 | 410 | 0 |
| 70 | 340 | 0 |

When the gap distance is less than 5 $\mu$m, the strength is sufficient, but failure often occurs during the heat impact test. When the gap distance exceeds 50 $\mu$m, the heat impact test results are satisfactory, but the shear strength remarkably decreases. Therefore, it is preferable that the gap distance is from about 5 $\mu$m to about 50 $\mu$m, and more preferably in the range of from about 10 $\mu$m to about 30 $\mu$m.

According to the first embodiment, the following effects may be obtained:

(1) Regarding the radio frequency electronic circuit parts including the flip chip 30 as the ceramic multi-layer substrate 40 and the SAW element directly mounted thereon, by use of the resin side walls 60 and the resin cover 61, the SAW element may be airtightly sealed, the influence of the solder member 50 when producing is eliminated, the production efficiency is heightened, the reliability for use is increased, the mounting efficiency at mounting may be increased, and the product may also be reduced in height.

Thus, with the radio frequency module parts being structured where the sides and upper part of mounting the module member are sealed airtightly by the resin side walls 60 and the resin cover 61, the problem for sealing airtight the SAW element may be solved.

With the face-down-bonding (flip chip mounting) being taken by gold-to-gold bonding of the flip chip 30 as the SAW element on a gold plated electrode of the ceramic multi-layer substrate 40, the problem of reduced durability against temperature change while reducing environmental influences on the SAW element may be solved. Particularly, with the thickness of gold plating and the diameter of the gold bump being made suitable in addition to the mounting of the flip chip by gold-to-gold bonding, the temperature change durability is improved. Specifically, the gold plated film of the mounted electrode 43 formed on the ceramic multi-layer substrate 40 is set to be between about 0.1 $\mu$m and about 5 $\mu$m, the distance between the flip chip 30 as the SAW element and the mounted electrode 43 is set to be between about 5 $\mu$m and about 50 $\mu$m or less, and the diameter of the gold bump for gold-to-gold bonding is set to be 50 $\mu$m or more and 50 $\mu$m or less.

In the manufacturing method, at least the member bonding portion of the surface conductive layer 42 of the member mounting ceramic multi-layer substrate 40 is gold-plated to form the mounting electrode 43, the members except at least one SAW element are mounted by soldering, the cleaning is performed, and subsequently the flip chip 30 as the SAW element is flip-chip mounted to the ceramic multi-layer substrate 40 by way of gold-to-gold bonding. The resin material of the side walls 60 and the resin cover 61 are bonded with the adhesive. In this method, the solder members to be mounted by soldering may follow the conventional method. The gold plated surface is sufficiently wet and fixed. With this manufacturing method, the problem of harmonizing the soldering process and the SAW element mounting process may be solved. However, as the surface of the substrate is dirty with scatters of flux and the residue of solder after mounting with solder, it is difficult to mount the SAW element to the gold surface of the SAW element mounting portion. According to the present embodiment, cleaning is performed to activate the gold surface so that no obstacle is present during mounting. The general medicine liquid cleaning activates the gold surface to an extent, thereby permitting the SAW element to be mounted. However, cleaning by plasma etching is preferable. In this case, it is important to prevent damage to other mounting members. Further, the resin such as the side walls 60 and the cover 61 is bonded in a vacuum so that dirt around the SAW and the attached elements may be eliminated.

Through the above-described structure and production method, it is possible to eliminate the problem of flattening the surface of the module and reducing the height of the module. As to the actual mounting of the members, it is preferable to comply with various mounting machines. There is no problem, of course, if all parts are flat, and if the upper surface of module is flat 30% or more, it is good, and more preferably 50% or more.

Figure 6:
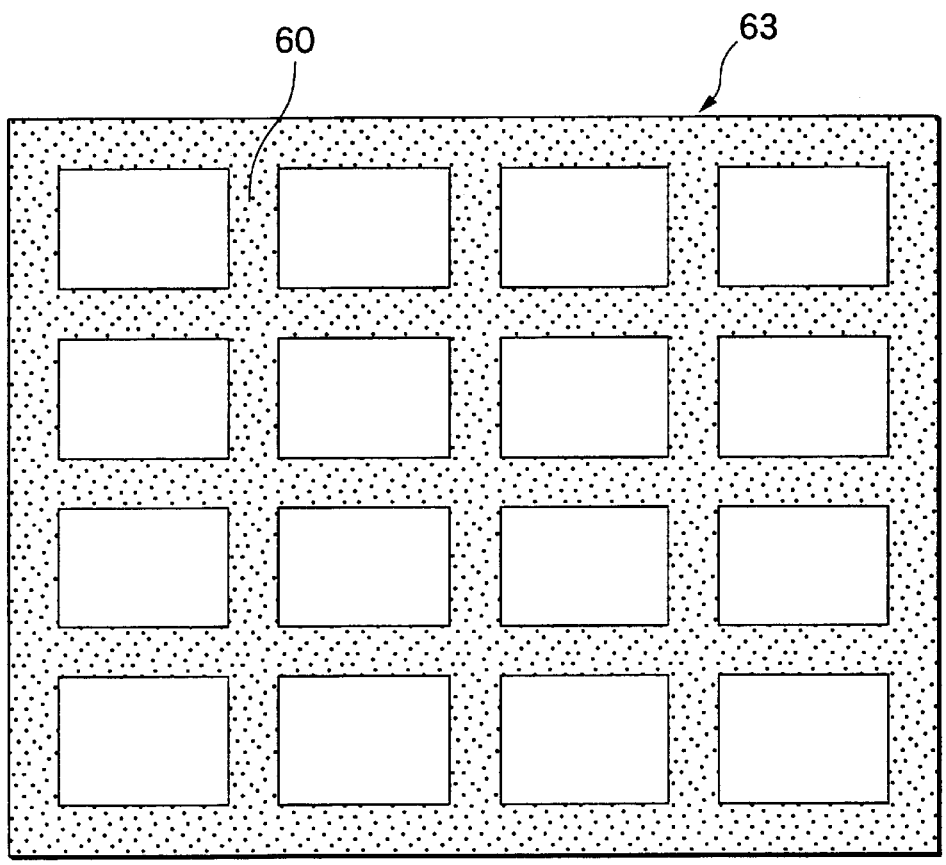
FIG. 6 is a plan view of the resin member to be used for the second mode.

FIGS. 5A to 5E show a second embodiment, showing that a plurality of pieces of the ceramic multi-layer substrates are treated simultaneously. In this case, the processes are the same as the processes shown in FIGS. 2A to 2D, from mounting the solder member on each ceramic multi-layer substrate 40 to cleaning the substrate as shown in FIG. 5A. Thereafter, as shown in FIG. 6, with preparation of a lattice-like resin member 63 having a plurality of portions (preferably 10 or more) formed in one body as so many resin side walls 60, a plurality of ceramic multi-layer substrates 40 (preferably 10 or more) are bonded on the lattice-like resin member 63 as shown in FIG. 5B. Subsequently, as shown in FIG. 5C, the flip chip 30 as the SAW element is face-down-bonded to a plurality of ceramic multi-layer substrate 40. Then, as shown in FIG. 5D, a resin plate 64 having a plurality of covers 61 formed in one body is bonded. Finally, as shown in FIG. 5E, the resin member 63 and the resin plate 64 are cut to be divided as individual members, each having one ceramic multi-layer substrates 40. In FIGS. 5A to 5E, the same portions as or corresponding to the portions of FIGS. 2A to 2G are denoted by use of the same reference numerals.

In the general method of mounting the solder member 50, a metal mask is placed on the flat substrate 40 and the solder paste is print-coated. The member 50 is then arranged and the solder is fixed through the reflow furnace. Therefore, if the resin member 63 as the side walls is bonded before the soldering process, the surface becomes uneven and the normal solder paste coating is difficult.

According to the second embodiment, in addition to the working effects of the first embodiment, a plurality of ceramic multi-layer substrates 40 may be treated simultaneously at least in a certain part of the production processes, thereby increasing manufacturing efficiency and reducing manufacturing costs. Namely, the problem for increasing the production efficiency by treating a plurality of ceramic multi-layer substrates simultaneously may be solved.

Figure 7:
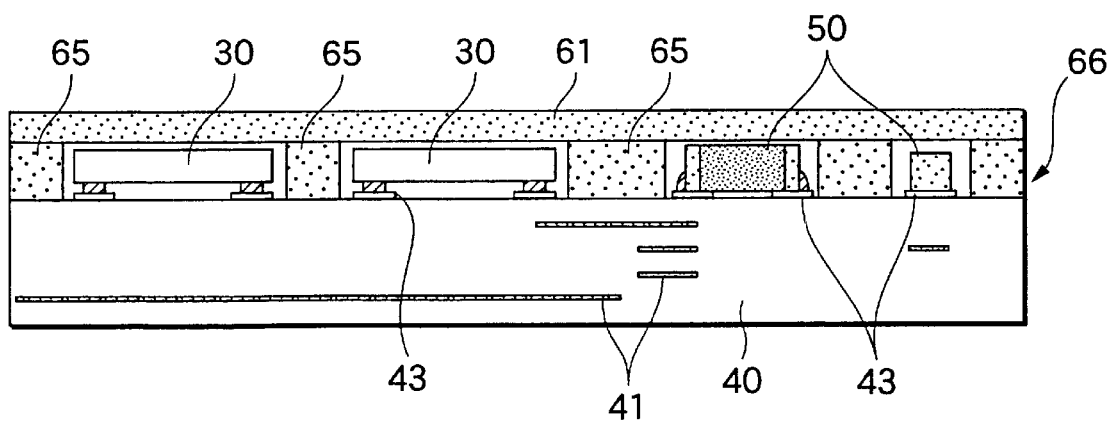
FIG. 7 is a front and cross-sectional view of a third mode for carrying out the invention shown.

FIG. 7 is a third embodiment, showing that the SAW element is isolated from the other members. In this case, the resin member 66 forming the side walls 65 is not simply square, but has holes hollowed out for receiving therein the flip chip 30 as the SAW element and the solder member 50 individually. The resin member 66 is bonded on the ceramic multi-layer substrate 40, and the epoxy resin plate as the cover 61 is bonded by the adhesive. The other part of the structure is the same as the first embodiment.

According to the third embodiment, the resin side walls 65 may be also provided between the flip chip 30 as the SAW element and the solder members as the other mounting members. In this case, each member may be isolated from the other members. Therefore, even if contaminating matter is produced from the other mounting members in practical use, this will not deteriorate the performance of the SAW element. Preferably, the structure of the resin side walls 65 and the cover 61 may be additionally consolidated. The other working effects are the same as those of the first embodiment.

Having explained the invention in reference to the embodiments, it will be apparent to those skilled in the art that the invention may be modified in many ways within the scope of the claims without departing from the invention.

As has been described, according to the invention, the surface acoustic wave elements and other surface mounting elements are mounted on the ceramic multi-layer substrate, wherein the SAW elements are flip chips which are face-down-bonded by way of gold-to-gold bonding to the gold coated electrodes of the ceramic multi-layer substrate, and at least the SAW elements are covered as sealed airtight by the side walls fixed to the multi-layer ceramic substrate and the cover covering the opening of the side walls. Therefore, the SAW elements may be kept airtight and the influence of the soldered surface mounting elements at the time of production is eliminated. Further, the productivity, the reliability for use, and the mounting efficiency at the time of mounting may be increased, and the height of the product may be reduced.

What is claimed is:

1. A manufacturing method of radio frequency module parts including surface acoustic wave elements, comprising:

plating a gold plate to at least portions of bonding parts of conductive surfaces of a ceramic multi-layer substrate;

mounting by soldering, after said plating, at least one surface mounting element other than the surface acoustic wave elements to said ceramic multi-layer substrate;

cleaning the multi-layer ceramic substrate after said soldering;

mounting, after said cleaning, flip chips of the surface acoustic wave elements by face-down-bonding to the ceramic multi-layer substrate by gold-to-gold bonding;

bonding side wall forming members to the ceramic multi-layer substrate, thereby forming side walls; and sealing a space surrounded by the side wall forming members and a cover forming member to be airtight by attaching the cover forming member after mounting the surface acoustic wave elements and forming the side walls.

2. The manufacturing method of the radio frequency module parts including the surface acoustic wave elements as set forth in claim 1, wherein said side walls are formed by bonding said side wall forming members in common to plural pieces of the ceramic multi-layer substrate, and at least parts of the following steps thereafter are carried out simultaneously, and the side wall forming members are cut per each ceramic multi-layer substrate.

3. The manufacturing method of the radio frequency module parts including the surface acoustic wave elements as set forth in claim 1 or 2, wherein the cleaning procedure is for cleaning said ceramic multi-layer substrate by way of a plasma etching.

4. A method for manufacturing radio frequency modules including at least one surface acoustic wave element, comprising:

plating a gold plate to at least portions of bonding parts of conductive surfaces of a ceramic multi-layer substrate;

mounting by soldering at least one other surface mounting element to said ceramic multi-layer substrate;

cleaning said ceramic multi-layer substrate;

mounting at least one flip chip of said at least one surface acoustic wave element by face-down-bonding using gold-to-gold bonding;

forming side walls from bonding members; and airtightly sealing said at least one surface acoustic wave element using said side walls and a cover, wherein the cleaning comprises plasma etching.

5. A method for manufacturing radio frequency modules including at least one surface acoustic wave element, comprising:

plating a gold plate to at least portions of bonding parts of conductive surfaces of a ceramic multi-layer substrate;

mounting by soldering at least one other surface mounting element to said ceramic multi-layer substrate;

cleaning said ceramic multi-layer substrate;

mounting at least one flip chip of said at least one surface acoustic wave element by face-down-bonding using gold-to-gold bonding;

forming side walls from bonding members; and airtightly sealing said at least one surface acoustic wave element using said side walls and a cover, wherein said side walls are formed by bonding said bonding members to plural pieces of said ceramic multilayer substrate, and wherein the cleaning comprises plasma etching.

* * * * *